(12) United States Patent
Gobrogge et al.

(10) Patent No.: US 7,229,297 B2
(45) Date of Patent: Jun. 12, 2007

(54) METHOD AND SYSTEM FOR MAKING AND USING AN ELECTRICAL CONNECTION BETWEEN A CONDUCTOR AND A CIRCUIT BOARD

(75) Inventors: Brian Gobrogge, Ann Arbor, MI (US); Gordon Andrews, Plymouth, MI (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/836,100

(22) Filed: Apr. 30, 2004

(65) Prior Publication Data

US 2005/0245111 A1 Nov. 3, 2005

(51) Int. Cl.
*H01R 4/58* (2006.01)
(52) U.S. Cl. .......................................... 439/86; 439/67
(58) Field of Classification Search .................. 439/86, 439/65, 67, 55, 73, 77, 493, 495; 29/628, 29/629, 884, 854; 361/785, 786, 789; 174/261; 257/773–776
See application file for complete search history.

(56) References Cited

U.S. PATENT DOCUMENTS

| | | | |
|---|---|---|---|
| 3,772,775 A * | 11/1973 | Bonnke et al. | 29/884 |
| 4,111,510 A * | 9/1978 | Zurcher | 439/67 |
| 4,531,793 A * | 7/1985 | Hochgesang | 439/55 |
| 5,209,671 A * | 5/1993 | Sugimoto et al. | 439/67 |
| 5,604,027 A | 2/1997 | Sheridon | |
| 5,723,204 A | 3/1998 | Stefik | |
| 6,093,054 A * | 7/2000 | Merkle et al. | 439/493 |
| 6,518,949 B2 | 2/2003 | Drzaic | |

* cited by examiner

*Primary Examiner*—Truc T. Nguyen
*Assistant Examiner*—Edwin A. Leon
(74) *Attorney, Agent, or Firm*—Pillsbury Winthrop Shaw Pittman, LLP

(57) ABSTRACT

A method and system for connecting and using a circuit board connected to a conductive element is disclosed. The circuit board includes a backstop and a plurality of conductive traces positioned on an edge. The conductive element includes a plurality of conductive layers and a plurality of insulating layers alternately placed along the length of the conductive element. The conductive element is placed between the edge of the circuit board having the conductive traces and a clasp prior to inserting the circuit board into the clasp. The conductive element is conformed between the circuit board and the clasp. Each conductive trace contacts a conductive layer as a result of the insertion. The backstop conforms an extending portion of the conductive element to be substantially perpendicular to the circuit board. The assembled device can be used to provide charge to a plurality of electrodes on a substrate simultaneously.

4 Claims, 4 Drawing Sheets

METHOD AND SYSTEM FOR MAKING AND USING AN ELECTRICAL CONNECTION BETWEEN A CONDUCTOR AND A CIRCUIT BOARD

TECHNICAL FIELD

This invention relates generally to the field of visual displays. More particularly, this invention relates to methods and systems of connecting a circuit board to a layered conductor/insulator wiper to permit an electrical charge to flow from the circuit board through the wiper to a substrate. The wiper may be used to program display data for an electric writeable medium.

BACKGROUND

Various types of electric writeable media, commonly known as electric paper, exist in the prior art. One example of electric paper includes a polymer substrate and bichromal anisotropic particles, such as balls or cylinders that are in suspension with an enabling fluid and are one color, such as white, on one side and a different color, such as black, on the other. Examples of such electric paper are described in U.S. Pat. No. 5,723,204 to Stefik and U.S. Pat. No. 5,604,027 to Sheridon, each of which is incorporated herein by reference in its entirety. Under the influence of an electric field, the particles rotate so that either the white side or the black side is exposed.

Another type of electric writeable media is known as an electronic ink display, such as the one described in U.S. Pat. No. 6,518,949 to Drzaic, which is incorporated herein by reference. An electronic ink display includes at least one capsule filled with a plurality of particles, made of a material such as titania, and a dyed suspending fluid. When a direct-current electric field of an appropriate polarity is applied across the capsule, the particles move to a viewed surface of the display and scatter light. When the applied electric field is reversed, the particles move to the rear surface of the display and the viewed surface of the display then appears dark.

Yet another type of electric writeable media, also described in U.S. Pat. No. 6,518,949 to Drzaic, includes a first set of particles and a second set of particles in a capsule. The first set of particles and the second set of particles have contrasting optical properties, such as contrasting colors, and can have, for example, differing electrophoretic properties. The capsule also contains a substantially clear fluid. The capsule has electrodes disposed adjacent to it connected to a voltage source, which may provide an alternating-current field or a direct-current field to the capsule. Upon application of an electric field across the electrodes, the first set of particles moves toward a first electrode, while the second set of particles moves toward a second electrode. If the electric field is reversed, the first set of particles moves toward the second electrode and the second set of particles moves toward the first electrode. Other examples of writeable media include liquid crystal, non-encapsulated electrophoretic displays and other displays.

A general problem with electric writeable media is that it is difficult to quickly provide a proper electrical charge to each electrode on a substrate during writing and erasing operations. This is particularly the case where a secondary device is used to charge the electrodes (i.e., the electrodes are not connected via switches to a power source). Conventional secondary devices for providing charge to electrodes include wands, bars and styluses.

In operation, a wand or bar is charged to a known voltage. The wand or bar is then moved in relation to the electric writeable medium containing the electrodes. As the wand nears an electrode, the electrode is charged to a voltage by the resulting electric field. Wands and bars can inadvertently charge electrodes adjacent to the intended electrode because no direct contact point is established between the wand/bar and the intended electrode. As a result, a wand or bar may not produce a crisp image because electrodes are unintentionally charged.

A stylus can also be used to apply charge to an electric writeable medium. Typically, a human operator controls the stylus. The stylus is charged to a known voltage and is moved over the electric writeable medium. The stylus directly contacts the electrodes of the electric writeable medium and deposits a charge on the electrodes that it contacts. However, a stylus may imprecisely deposit charge due to human error. For example, the human operator may not precisely contact each intended electrode. As a result, the displayed image is likely to emulate handwriting. Even if a machine is used to precisely guide the stylus, the stylus has the disadvantage or being a point contact device. In other words, the stylus must contact each electrode that is to receive a charge. Thus, programming the entire electric writeable medium using a stylus can require a significant amount of time.

Therefore, a need exists for a method and system for making a device that precisely provides electrical charge to electrodes of an electric writeable medium.

A further need exists for a method of rapidly applying charge to a plurality of electrodes simultaneously using a secondary apparatus.

The invention described herein is directed to solving one or more of the above-listed problems.

SUMMARY

Before the present methods and systems are described, it is to be understood that this invention is not limited to the particular methodologies and systems described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a," "an," and "the" include plural references unless the context clearly dictates otherwise. Thus, for example, reference to an "island" is a reference to one or more islands and equivalents thereof known to those skilled in the art, and so forth. Unless defined otherwise, all technical and scientific terms used herein have the same meanings as commonly understood by one of ordinary skill in the art. Although any methods, materials, and devices similar or equivalent to those described herein can be used in the practice or testing of embodiments of the present invention, the preferred methods, materials, and devices are now described. All publications mentioned herein are incorporated by reference. Nothing herein is to be construed as an admission that the invention is not entitled to antedate such disclosure by virtue of prior invention.

In an embodiment, a method of attaching a conductive element to a circuit board includes arranging a conductive element between a circuit board and a clasp and conforming a first portion of the conductive element between the circuit board and the clasp. The method may also include pressing the circuit board into the clasp, The circuit board may include a backstop. In an embodiment, the method may further include conforming, using the backstop, a second portion of the conductive element into a position substantially perpendicular to the circuit board. The clasp may be made of a non-conductive material and may include one or more metal clips. In an embodiment, the conductive element is a conductor/insulator silicone rubber strip.

In an embodiment, a system for applying an electrical charge to a substrate includes a circuit board having a backstop and a plurality of conductive traces positioned on an edge of the circuit board, a conductive element having a plurality of conductive layers and a plurality of insulating layers alternately placed along the length of the conductive element, and a clasp. The clasp affixes a first portion of the conductive element to the circuit board. The first portion of the conductive element is conformed between the circuit board and the clasp. As a result, each of the conductive layers may contact one of the conductive traces. A second portion of the conductive element is conformed by the backstop into a position substantially perpendicular to the circuit board. The clasp may be made of a non-conductive material and may include one or more metal clips. In an embodiment, the conductive element is a conductor/insulator silicone rubber strip.

In an embodiment, a method for applying an electrical charge to electrodes on a substrate includes providing power to a first grouping of conductive layers of an conductive element having a plurality of conductive layers and a plurality of insulating layers alternately placed along the length of the conductive element, and charging one or more electrodes in a first row of electrodes on a substrate using the conductive element. Each electrode in the first row may correspond to a conductive layer. In an embodiment, the method further includes moving the conductive element so that the conductive element contacts a second row of electrodes, providing power to a second grouping of conductive layers of the conductive element, and charging one or more electrodes in the second row of electrodes using the conductive element. In the embodiment, each electrode in the second row corresponds to a conductive layer. In an embodiment, the method further includes moving the substrate so that the conductive element contacts a second row of electrodes, providing power to a second grouping of conductive layers of the conductive element, and charging one or more electrodes in the second row of electrodes using the conductive element. In the embodiment, each electrode in the second row corresponds to a conductive layer. In an embodiment, the method further includes compressing the conductive element such that the electrode-contacting portion of the conductive element comprises a corner edge of the conductive element. In an embodiment, the plurality of electrodes are arranged substantially in a grid pattern. In an embodiment, the plurality of electrodes are arranged in a plurality of columns. Each column of electrodes may correspond to a conductive layer.

BRIEF DESCRIPTION OF THE DRAWINGS

Aspects, features, benefits and advantages of the embodiments of the present invention will be apparent with regard to the following description, appended claims and accompanying drawings where:

DETAILED DESCRIPTION

Figure 1A:
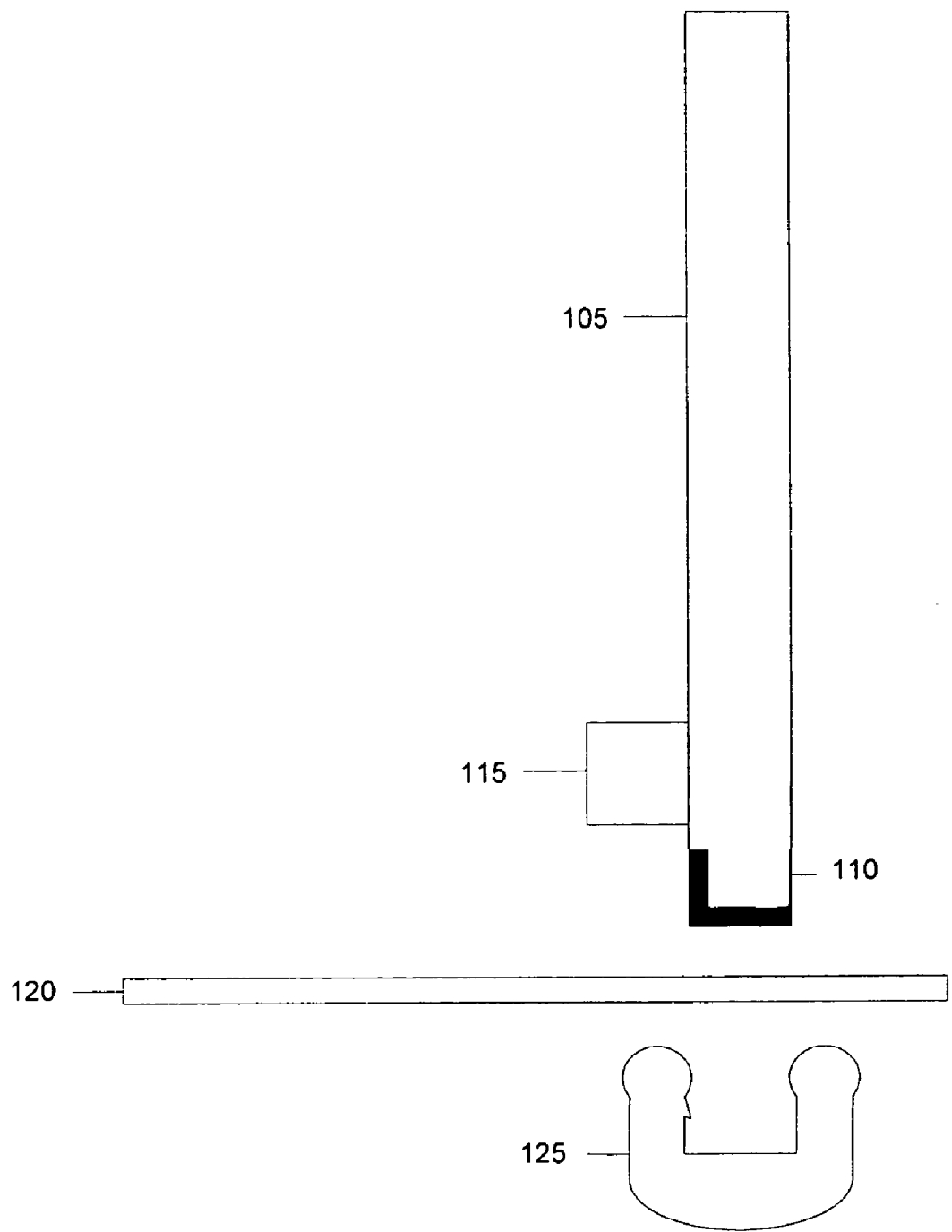
FIG. 1A depicts a cross-sectional representation of exemplary components for creating an electrical connection between a conductive element and a circuit board according to an embodiment.

FIG. 1A depicts a cross-sectional representation of exemplary components for creating an electrical connection between a conductive element and a circuit board according to an embodiment. The circuit board 105 may have a plurality of conductive traces 110 on a side leading up to an edge and a backstop 115. In FIG. 1A, a cross-sectional view is shown with only one conductive trace 110. However, multiple conductive traces 110 may be positioned on the side of the circuit board having conductive trace 110. The conductive traces 110 may be made of, for example, copper or any other conductive material. The backstop 115 may be made of, for example, phenolic resin or any other semi-strong, non-conductive material. In an embodiment, the backstop 115 extends approximately 0.125 inches above the surface of the circuit board 105 to which it is attached.

Figure 2:
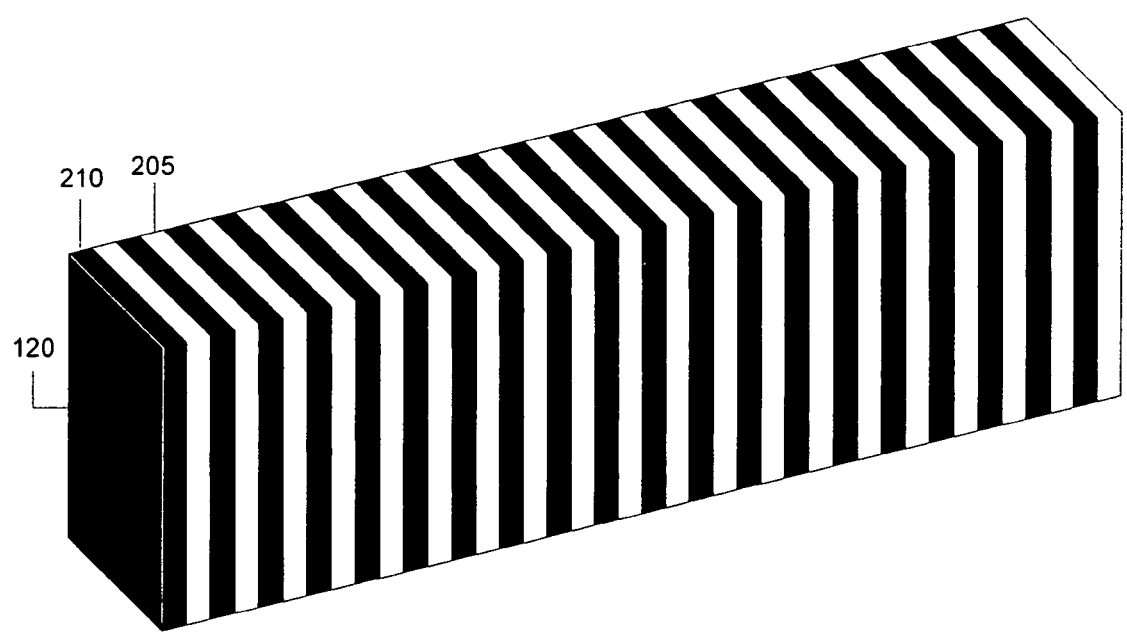
FIG. 2 depicts an exemplary secondary device used as a conductive element according to an embodiment.
Figure 3:
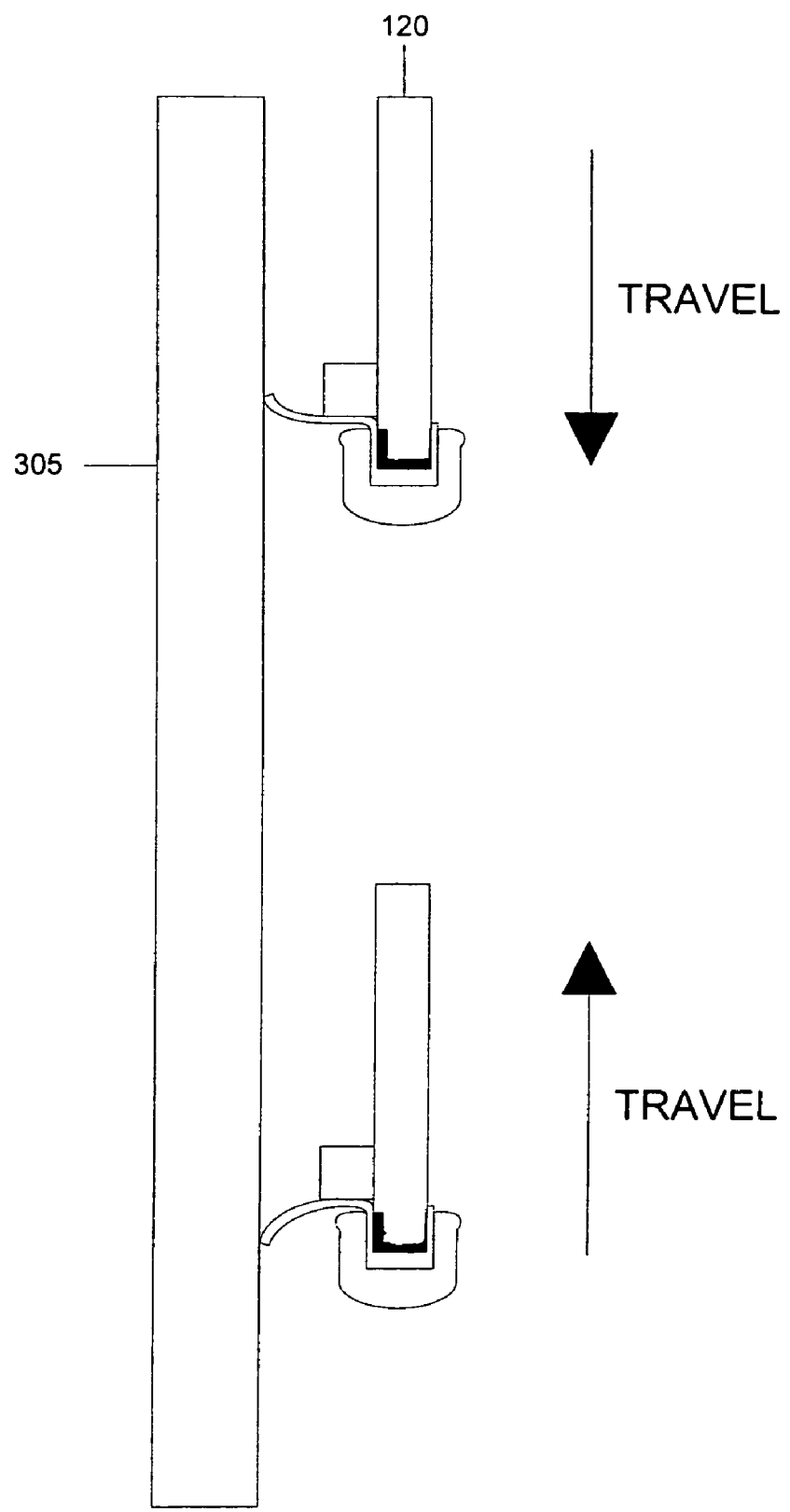
FIG. 3 depicts an exemplary manner of use of the secondary device to program an electric writeable media according to an embodiment.

A conductive element, such as the wiper 120 shown in FIG. 2, may have a plurality of alternating layers of insulating material 205 and conducting material 210. The wiper 120 may be, for example, a Zebra® wiper made by FujiPoly America Corporation. The number of insulators 205 and conductors 210 may vary depending upon the length of the wiper 120, which may be, for example, up to approximately 8.5 inches. In an embodiment, the wiper 120 is 0.015 inches wide. Other sizes are possible. The pitch of the insulators 205 and conductors 210 may be selected based upon the spacing of the conductive traces 110 on the circuit board 105.

Referring back to FIG. 1A, the clasp 125 may be sized to receive the end of the circuit board 105 that includes the plurality of conductive traces 110. The clasp 125 maybe used to affix the wiper 120 to the circuit board 105. The clasp 125 may be made of a non-conductive or insulating material, such as rubber, to prevent shorting conductive layers 210 of the wiper 120 during operation and may include internal metal clips, which may be made of, for example, aluminum, to provide a more secure connection to the circuit board 105. In an embodiment, the clasp 125 includes a nub 130 that promotes conduction between the conductive traces 110 of the circuit board 105 and the conductive layers 210 of the wiper 120 by providing additional compressive force upon insertion of the circuit board 105.

Figure 1B:
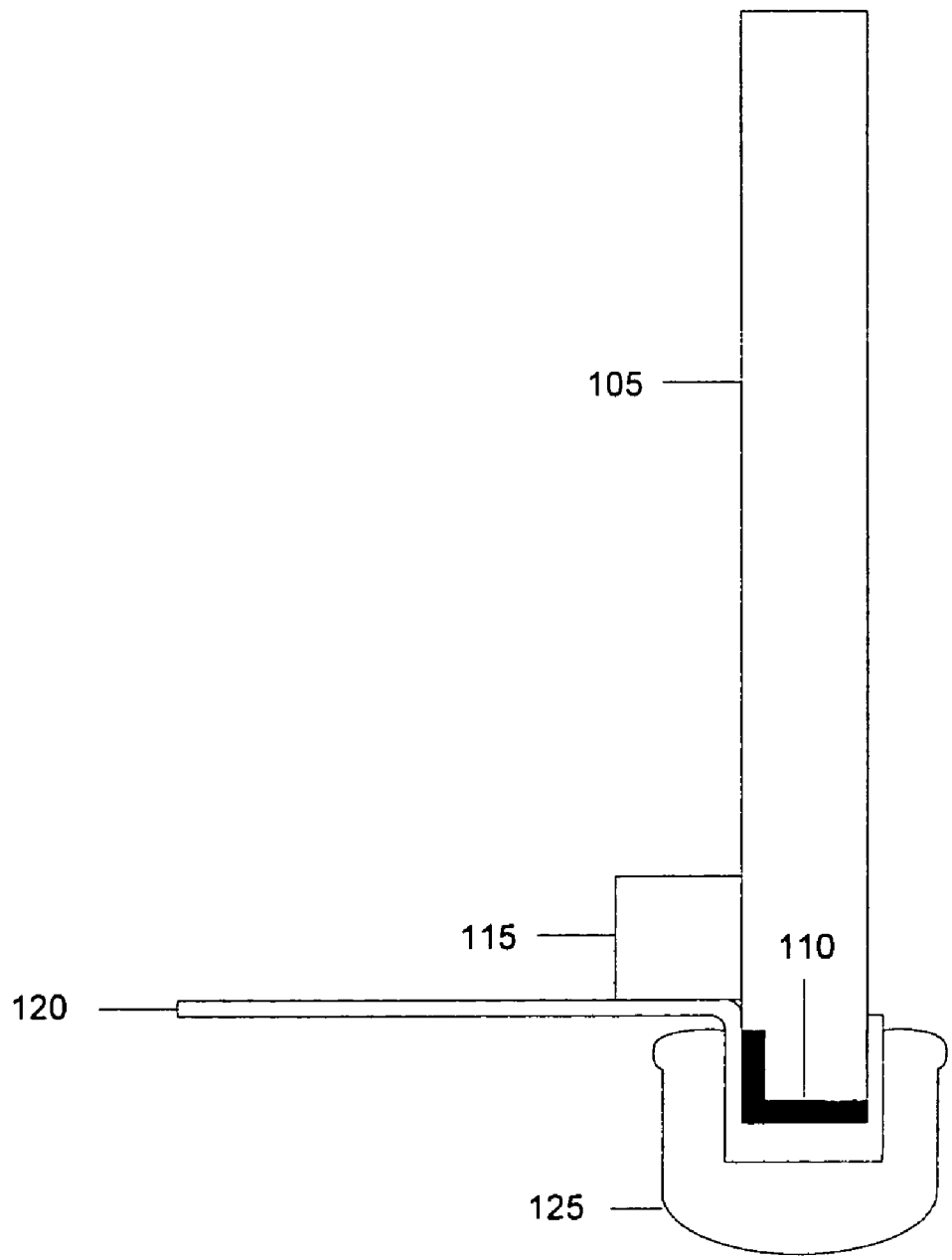
FIG. 1B depicts a cross-sectional representation of the connection between the conductive element and a circuit board according to an embodiment.

The method of forming the electrical connection between the circuit board 105 and the wiper 120 may include placing the wiper 120 between the open end of the clasp 125 and the edge of the circuit board 105 that includes the plurality of conductive traces 110. The circuit board 105 may then be pressed into the clasp 125. As a result, the wiper 120 may be conformed between the circuit board 105 and the clasp 125 such that each conductive trace 110 contacts a conductive layer 210 of the wiper 120. The backstop 115 may direct a portion of the wiper 120 that is not located within the clasp 125 into a position that is substantially perpendicular to the circuit board 105. A representation of a device constructed according to the described embodiment is shown in FIG. 1B.

Once formed, the assembled device may be used to transfer charge from the circuit board 105 to, for example, an electric writeable medium 305. The electric writeable medium 305 may include a plurality of electrodes (not shown). In an embodiment, the electrodes are positioned in a plurality of columns. In an embodiment, the electrodes may be positioned in a grid-like pattern. In an embodiment, the electrodes are positioned such that conductive layers 210 of the wiper 120 contact electrodes in adjacent columns simultaneously. Alternate arrangements of electrodes may also be used.

In operation, the wiper 120 may be moved across the electric writeable medium 305 in a direction parallel to the columns of electrodes. In an embodiment, pulleys and or timing belts (not shown) are used to ensure that the wiper 120 is moved at a rate that permits the polarity of the conductive layers 210 to be switched between electrodes as the wiper 120 moves across the electric writeable medium 305.

As the wiper 120 moves across the electric writeable medium 305, the contacting edge of the wiper 120 may trail the backstop 115. By applying a proper amount of force to the board via the clasp 125, the beneficial effect of limiting the contact surface area between the wiper 120 and an electrode to an edge of a conductive layer 210 may result. The force required to achieve this beneficial effect is dependent upon the length, width, height, compressed height and elasticity of the wiper 120. In an embodiment, the required force may be computed using Eqn. 1. The value of the elasticity constant in Eqn. 1 is dependent upon the materials from which the wiper 120 is constructed.

$$\text{Force} = k\left(\frac{H_1}{H}\right)(L)(W),\qquad \text{(Eqn. 1)}$$

where: k=elasticity constant;
H=height of wiper 120;
$H_1$=compressed height of wiper 120;
L=length of wiper 120; and
W=width of wiper 120.

In an embodiment, k is 9 lbs./in.$^2$, H is 0.25 in., $H_1$ is 0.0625 in., L is 8.5 in. and W is 0.015 in. Accordingly, the applied force for such an embodiment is 0.287 lbs. Other applied forces and equations may be used, provided that the force allows the wiper to contact the islands and conform to any variability in island height as the wiper moves across the islands.

If a proper amount of force is applied, only one electrode in a column of the electric writeable medium 305 may be in contact with a conductive layer 210 of the wiper 120 at a given time. However, a plurality of columns, including potentially all columns, may have an electrode charged simultaneously using this process. By altering the supplied charge to each conductive layer 210 as the wiper 120 is moved across the electric writeable medium 305, the wiper 120 may be used to charge selected electrodes of the entire electric writeable medium 305 in one pass. In an embodiment, the wiper 120 remains stationary while the electric writeable medium 305 is moved. In an embodiment, each of the wiper 120 and the electric writeable medium 305 moves at differing rates and/or in different directions relative to each other.

The wiper 120 may be used to write information to and/or erase information from the electric writeable medium 305. Whether the wiper 120 writes or erases information may depend upon the polarity of the conductive layers 210 with respect to the backplane of the electric writeable medium 305.

An electric writeable medium 305 may include a substrate including a plurality of changeable elements, a insulating layer having one or more conductive electrodes, and a backplane. In an embodiment, an element may include a GYRICON® bead having, for example, two hemispheres of differing colors, such as black and white. Changing the orientation of an element produces "written" and "erased" colors. The elements may each have an intrinsic electric dipole so that the orientation of the element conforms to an applied electric field. When a field exists between an electrode and the backplane of the electric writeable medium 305, one or more elements proximate to the electrode may rotate in response to the field. Depending upon the polarity of the field, one of the "written" (i.e., black) and the "erased" (i.e., white) hemispheres of an element may be displayed to an observer. If no field exists between the electrode and the backplane, the element may maintain its orientation. The colors black and white are used only to illustrate contrasting examples; in fact any two colors, which may include two shades of a single color, may be used within the scope of the invention. Note that the use of black and white hemispheres is merely illustrative and that other colors or elements, such as those described above, may be used.

In an embodiment, the assembled device may be used as part of a printer. The combination of the circuit board 105 and the conductive element 120 may be used to print information on electric paper as it is drawn through the printer. In such an embodiment, the electric paper is moved in relation to the conductive element 120.

Although the invention has been described with reference to the above embodiments, it will be apparent to one skilled in the art that variations and modifications are contemplated within the spirit and scope of the invention. The drawings and description of the disclosed embodiments are made by way of example rather than to limit the scope of the invention, and it is intended to cover within the spirit and scope of the invention all such changes and modifications.

What is claimed is:

1. A system for applying an electrical charge to a substrate, the system comprising:
    a circuit board with an attached backstop that is positioned close to an edge of the circuit board and a plurality of conductive traces positioned on the edge of the circuit board;
    a conductive element having a plurality of conductive layers and a plurality of insulating layers such that the conductive layers and insulating layers are alternately placed along the length of the conductive element; and
    a clasp having a nub to provide additional compressive force and configured to affix a first portion of the conductive element to an end of the circuit board such that each of the conductive layers contacts one of the conductive traces,
    wherein the first portion of the conductive element is conformed between the end of the circuit board and the clasp and a second portion of the conductive element is urged by the backstop to be substantially perpendicular to the circuit board.

2. The system of claim 1 wherein the conductive element comprises a conductor/insulator silicone rubber strip.

3. The system of claim 1 wherein the clasp comprises a non-conductive material.

4. The system of claim 3 wherein the clasp further comprises one or more metal clips.

* * * * *